(12) United States Patent
Fukuda et al.

(10) Patent No.: US 10,128,136 B2
(45) Date of Patent: Nov. 13, 2018

(54) LIQUID PROCESSING APPARATUS AND LIQUID PROCESSING METHOD

(71) Applicant: Tokyo Electron Limited, Tokyo (JP)

(72) Inventors: Masahiro Fukuda, Koshi (JP); Hiroshi Ichinomiya, Koshi (JP); Koichi Obata, Koshi (JP); Taro Yamamoto, Koshi (JP); Kouichirou Tanaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/671,325

(22) Filed: Aug. 8, 2017

(65) Prior Publication Data

US 2018/0047592 A1 Feb. 15, 2018

(30) Foreign Application Priority Data

Aug. 10, 2016 (JP) ................. 2016-157997

(51) Int. Cl.
| | |
|---|---|
| *H01L 21/76* | (2006.01) |
| *H01L 21/67* | (2006.01) |
| *B05C 5/02* | (2006.01) |
| *B05C 11/08* | (2006.01) |
| *B05C 11/10* | (2006.01) |
| *B08B 3/08* | (2006.01) |

(Continued)

(52) U.S. Cl.
CPC ........ *H01L 21/6715* (2013.01); *B05C 5/0258* (2013.01); *B05C 11/08* (2013.01); *B05C 11/1002* (2013.01); *B08B 3/08* (2013.01); *B08B 3/10* (2013.01); *G03F 7/162* (2013.01); *G03F 7/3021* (2013.01); *H01L 21/0273* (2013.01); *H01L 21/67051* (2013.01); *H01L 21/67178* (2013.01)

(58) Field of Classification Search
CPC ......... H01L 21/67051; H01L 21/67173; H01L 21/6715; H01L 21/02074; H01L 21/2885; H01L 21/67028; H01L 21/67219; H01L 21/02087; H01L 21/0209; H01L 21/288; H01L 21/3212; H01L 21/67161; C25D 7/123
See application file for complete search history.

(56) References Cited

U.S. PATENT DOCUMENTS

2008/0280054 A1* 11/2008 Ogata ............... H01L 21/67051
427/425

FOREIGN PATENT DOCUMENTS

| JP | 2010-206019 A | 9/2010 |
| JP | 2015-176996 A | 10/2015 |

* cited by examiner

*Primary Examiner* — Robert Bachner
(74) *Attorney, Agent, or Firm* — Pearne & Gordon LLP

(57) ABSTRACT

There is provided a guide member 3 in which an inclined surface 32 thereof is inclined downwardly outwards from an edge portion of a rear surface of a horizontally held wafer W; and a cylindrical surrounding member 2 which surrounds the wafer W and in which an upper peripheral portion thereof is inwardly extended obliquely upwards. Further, the surrounding member 2 has, at an inner surface side thereof, two groove portions 23 extended along an entire circumference and located above a height position of the horizontally held wafer W. If an air flow flows along the surrounding member 2, a vortex flow is formed within the groove portions 23 and stays therein. Thus, mist can be captured, so that the flow of the mist to the outside of a cup body 1 can be suppressed. Accordingly, the adhesion of the mist to the wafer W can be suppressed.

19 Claims, 8 Drawing Sheets

(51) Int. Cl.
*B08B 3/10* (2006.01)
*G03F 7/16* (2006.01)
*H01L 21/027* (2006.01)
*G03F 7/30* (2006.01)

LIQUID PROCESSING APPARATUS AND LIQUID PROCESSING METHOD

CROSS-REFERENCE TO RELATED APPLICATION

This application claims the benefit of Japanese Patent Application No. 2016-157997 filed on Aug. 10, 2016, the entire disclosures of which are incorporated herein by reference.

TECHNICAL FIELD

The embodiments described herein pertain generally to a technique of performing a processing by supplying a processing liquid while rotating a horizontally held substrate around a vertical axis.

BACKGROUND

Conventionally, in a developing apparatus for use in a system configured to form a resist pattern on a substrate, there is performed a series of processes of attracting and holding a semiconductor wafer (hereinafter, simply referred to as "wafer") used as the substrate by a substrate holding unit provided in a cylindrical cup body, supplying a developing liquid onto a surface of the wafer from a developing liquid nozzle, cleaning the wafer by supplying a cleaning liquid from a cleaning nozzle while rotating the wafer, and drying the wafer by scattering.

At this time, by performing the liquid processings by supplying the processing liquids onto the wafer while evacuating the inside of the cup body through an exhaust port opened in the cup body, mist or particles generated by the scattering of the processing liquids can be suppressed from adhering to the wafer.

Recently, as devices are miniaturized, there has been a demand for a higher detergency after a developing processing. The present inventor has investigated a method of performing the cleaning while spinning the wafer at a high speed of, e.g., 4000 rpm. If the RPM of the wafer is increased, however, the cleaning liquid may be easily scattered from the wafer. In such a case, the liquid-scattering of the cleaning liquid scattered back from the cup body may be increased, or the amount of the mist of the cleaning liquid scattered from the wafer may also be increase, so that there is a problem that the amount of mist reattached to the surface of the wafer is increased.

Patent Document 1 describes a technique of suppressing a liquid-scattering back to a substrate and reattachment of mist thereto. In this technique, however, a rotational speed of a wafer is about 2500 rpm, and this method does not mention anything about a case where the RPM of the wafer is higher than this.

Further, Patent Document 2 discloses a technique of cleaning an inside of a cup body by allowing a cleaning liquid scattered form a wafer to flow along an inner surface of the cup body to suppress contamination of the wafer by mist adhering to the cup body. This technique, however, is not directed to suppressing a liquid-scattering back to the wafer and reattachment of mist to the wafer.

Patent Document 1: Japanese Patent Laid-open Publication No. 2010-206019
Patent Document 2: Japanese Patent Laid-open Publication No. 2015-176996

SUMMARY

In view of the foregoing, exemplary embodiments provide a technique of suppressing reattachment of mist to a substrate in a liquid processing apparatus configured to perform a processing by supplying a processing liquid onto the substrate which is being rotated around a vertical axis.

In an exemplary embodiment, there is provided a liquid processing apparatus configured to perform a processing by supplying a processing liquid onto a substrate from a nozzle. The liquid processing apparatus includes a substrate holding unit configured to hold the substrate horizontally and rotate the substrate around a vertical axis; a surrounding member, surrounding the substrate held by the substrate holding unit, in which an upper portion thereof is inwardly extended obliquely upwards; a guide member, surrounding a space under the substrate holding unit along a circumferential direction of the substrate holding unit, in which an inclined surface is formed to be inclined downwardly outwards from a position which is close to and faces an edge portion of a rear surface of the substrate held by the substrate holding unit; and a gas exhaust mechanism configured to exhaust an atmosphere around the substrate through a gap between the surrounding member and the guide member. At least one groove portion extended along an entire circumference of the surrounding member is formed at a position of an inner peripheral surface of the surrounding member, and the position is located above a height position of a top surface of the substrate held by the substrate holding unit.

In another exemplary embodiment, a liquid processing method includes performing a liquid processing by supplying a processing liquid onto a horizontally held substrate and rotating the substrate at a rotational speed equal to or higher than 4000 rpm in a liquid processing apparatus including a substrate holding unit configured to hold the substrate horizontally and rotate the substrate around a vertical axis; a surrounding member, surrounding the substrate held by the substrate holding unit, in which an upper portion thereof is inwardly extended obliquely upwards; a guide member, surrounding a space under the substrate holding unit along a circumferential direction of the substrate holding unit, in which an inclined surface is formed to be inclined downwardly outwards from a position which is close to and faces an edge portion of a rear surface of the substrate held by the substrate holding unit; and a gas exhaust mechanism configured to exhaust an atmosphere around the substrate through a gap between the surrounding member and the guide member. Further, a groove portion extended along an entire circumference of the surrounding member is formed at a position of an inner peripheral surface of the surrounding member, and the position is located above a height position of a top surface of the substrate held by the substrate holding unit.

According to the exemplary embodiments, in supplying the processing liquid onto the substrate while rotating the substrate held by the substrate holding unit and performing the evacuation through the gap between the surrounding member surrounding the substrate and the guide member surrounding the space under the substrate, the groove portion extended in the circumferential direction is provided at the upper edge portion of the inner peripheral surface of the surrounding member. With this configuration, when mist generated from the processing liquid scattered from the substrate attempts to flow out along the surrounding member, the mist is captured by the groove portion. Therefore, even when performing the liquid processing by rotating the substrate at the high rotational speed, the outflow of the mist can be suppressed, so that the reattachment of the mist to the substrate can be suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
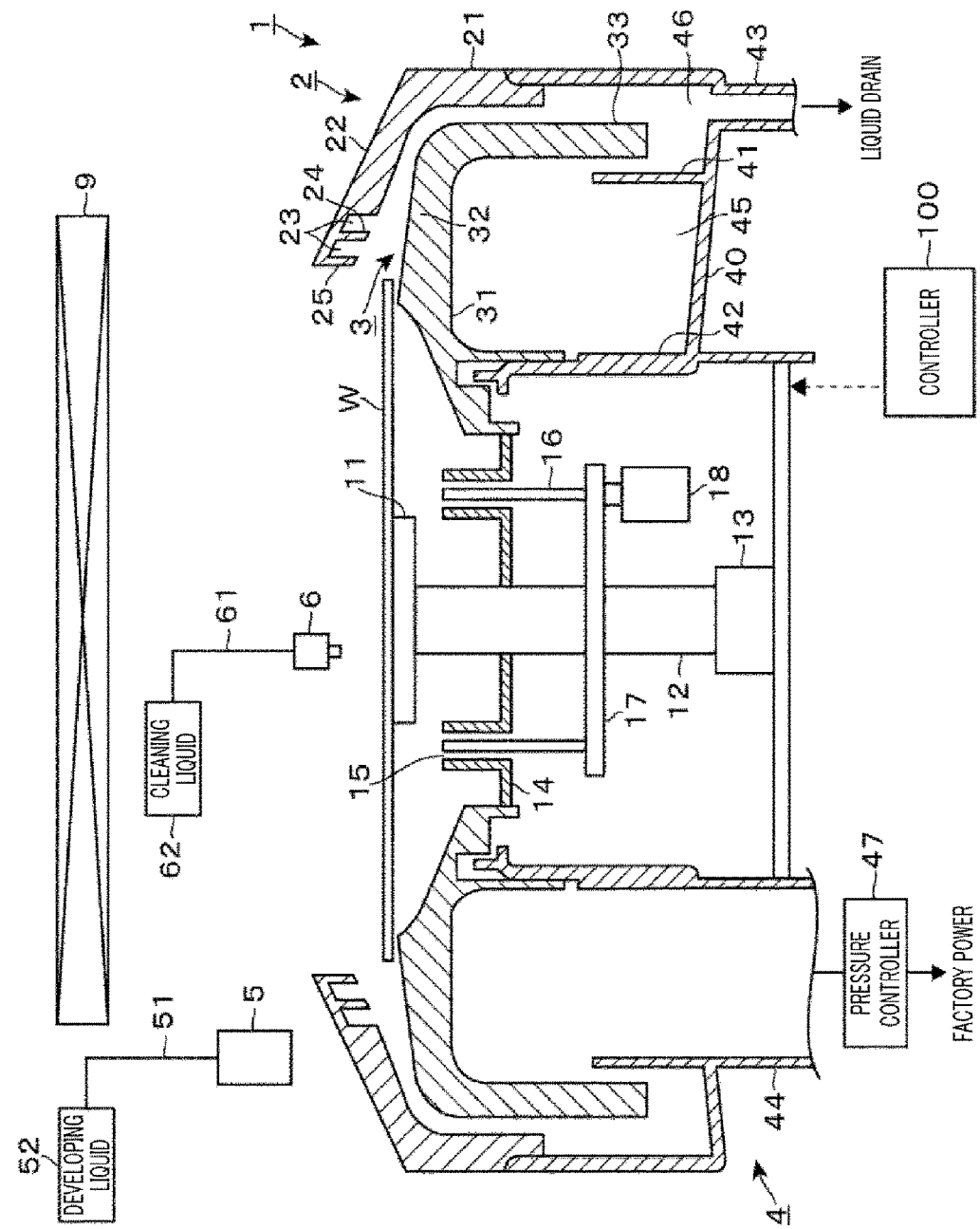
FIG. 1 is a cross sectional view of a developing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of the present disclosure will be explained in detail with reference to the accompanying drawings.

An exemplary embodiment in which a liquid processing apparatus of the present disclosure is applied to a developing apparatus will be discussed. As shown in FIG. 1, the developing apparatus is equipped with a spin chuck 11 as a substrate holding unit configured to attract a central portion of a rear surface of a wafer W as a substrate and hold the wafer W horizontally. The spin chuck 11 is connected to a rotating mechanism 13 via a rotation shaft 12 and configured to rotate the wafer W around a vertical axis.

A horizontal plate 14 surrounding the rotation shaft 12 is provided under the spin chuck 11. The horizontal plate 14 is provided with three holes 15 which are formed through the horizontal plate 14 in a vertical direction and equi-spaced along a circumferential direction thereof. Elevating pins 16 are provided in the corresponding holes 15, and these elevating pins 16 are connected to an elevating mechanism 18 via an elevating plate 17 and configured to be movable up and down.

Figure 2:
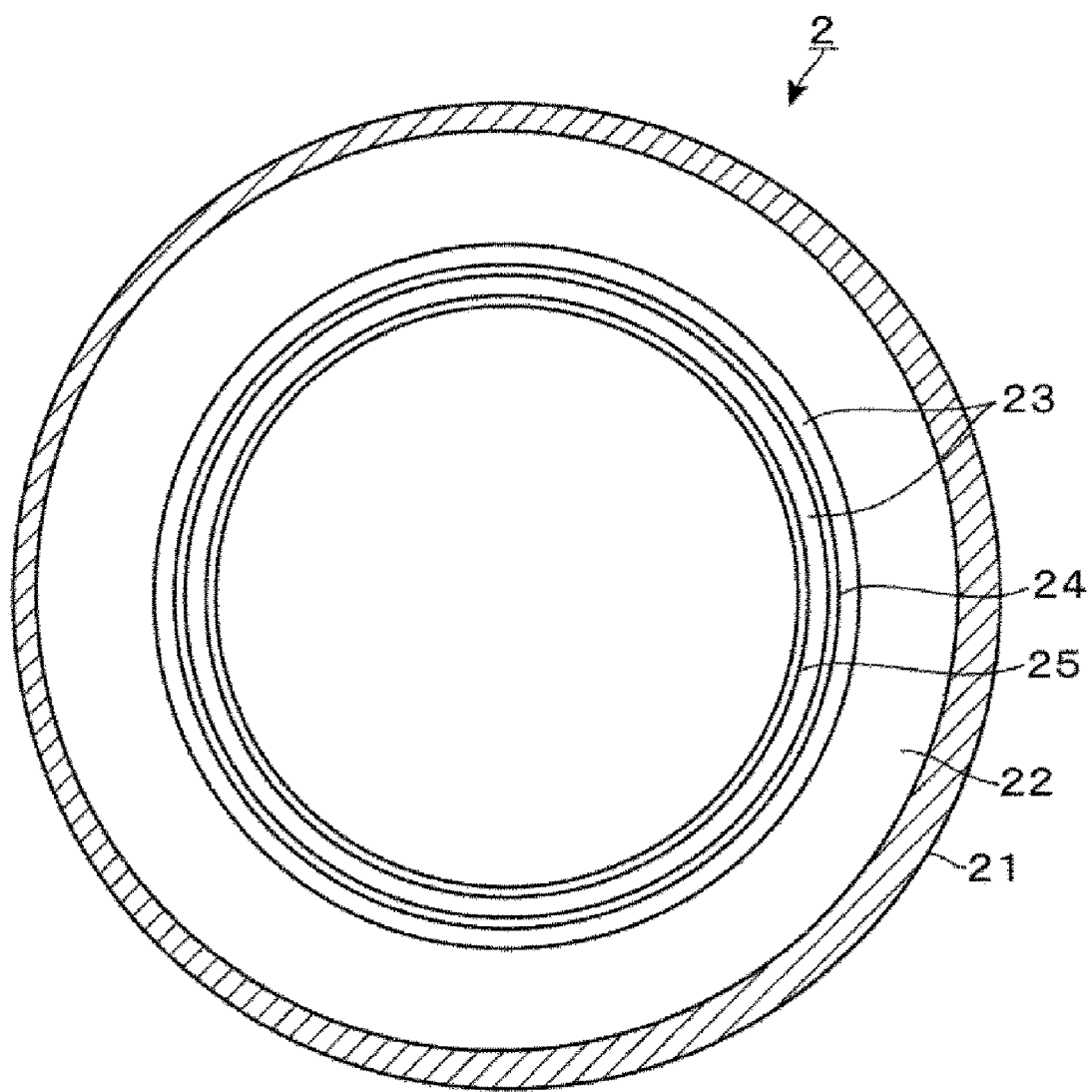
FIG. 2 is a cross sectional view of a surrounding member of the developing apparatus seen from an inside thereof.

Further, a cup body 1 surrounding a region including a side direction of the wafer W placed on the spin chuck 11 is provided. The cup body 1 has an uprightly standing cylindrical portion 21, and an upper side of the cylindrical portion 21 has a larger thickness whereas a lower side of the cylindrical portion 21 has a smaller thickness. An inclined portion 22 inwardly extended obliquely upwards is provided along an entire circumference of an upper edge portion of the cylindrical portion 21. As depicted in FIG. 2, two groove portions 23 are formed and vertically arranged in two levels on an inner peripheral surface of an upper end portion of the inclined portion 22. Each of the groove portions 23 is extended along the entire circumference of the inclined portion 22. The cylindrical portion 21 and the inclined portion 22 correspond to a surrounding member 2.

Referring back to FIG. 1, a ring-shaped body 4 is disposed under the surrounding member 2. The ring-shaped member 4 has a bottom surface portion 40 having a ring shape, and a lower end of the cylindrical portion 21 is connected to an outer edge of the bottom surface portion 40. Further, an uprightly standing inner cylindrical portion 42 is formed at an inner edge of the bottom surface portion 40. Furthermore, a partition wall 41 is extended upwards from the bottom surface portion 40 along the circumferential direction, and the ring-shaped body 4 is divided into an inner region 45 and an outer region 46 by the partition wall 41. A liquid drain port 43 as a drain path for draining a collected developing liquid or the like is provided in a bottom portion of the outer region 46. Furthermore, a cylindrical gas exhaust port 44 extended upwards from the bottom surface portion 40 is inserted into the inner region 45 from below, and an upper end of the gas exhaust port 44 is opened at a position higher than a lower end of a vertical wall 33 to be described later. A lower end of the gas exhaust port 44 is connected to one end of a gas exhaust line, and the other end of the gas exhaust line is connected to a factory exhaust line (factory power) via a pressure controller 47. The gas exhaust port 44, the pressure controller 47 and the factory exhaust line correspond to a gas exhaust mechanism.

A guide member 3 is provided around the horizontal plate 14 under the wafer W held by the spin chuck 11. The guide member 3 has a plate-shaped portion 31 having a ring-shaped and a substantially mountain-shaped cross section, and a bottom surface of the plate-shaped portion 31 is connected with an upper end of the inner cylindrical portion 42 of the ring-shaped body 4. Further, the downwardly extending vertical wall 33 is provided at an edge portion of the plate-shaped portion 31 along the entire circumference thereof. The guide member 3 is placed such that an apex portion thereof faces a bottom surface of an edge portion of the wafer W held by the spin chuck 11 with a gap therebetween, and the guide member 3 is provided with an inclined surface 32 downwardly inclined outwards from the apex portion. The inclined surface 32 of the guide member 3 and an inner surface of the inclined portion 22 of the surrounding member 2 are disposed to face each other with a gap therebetween. Further, the vertical wall 33 of the guide member 3 is inserted into the outer region 46 of the ring-shaped body 4, and gaps are respectively provided between the vertical wall 33 and an inner peripheral surface of the cylindrical portion 21, between the vertical wall 33 and the partition wall 41 and between the vertical wall 33 and the bottom surface portion 40.

Figure 3:
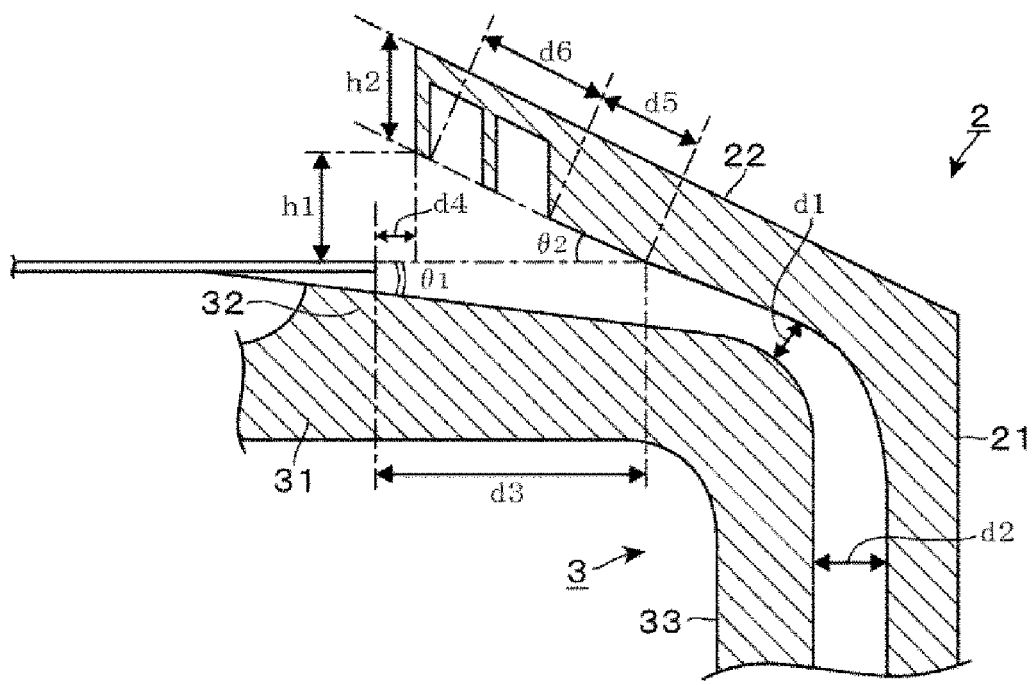
FIG. 3 is an enlarged cross sectional view of a cup body in the developing apparatus.
Figure 4:
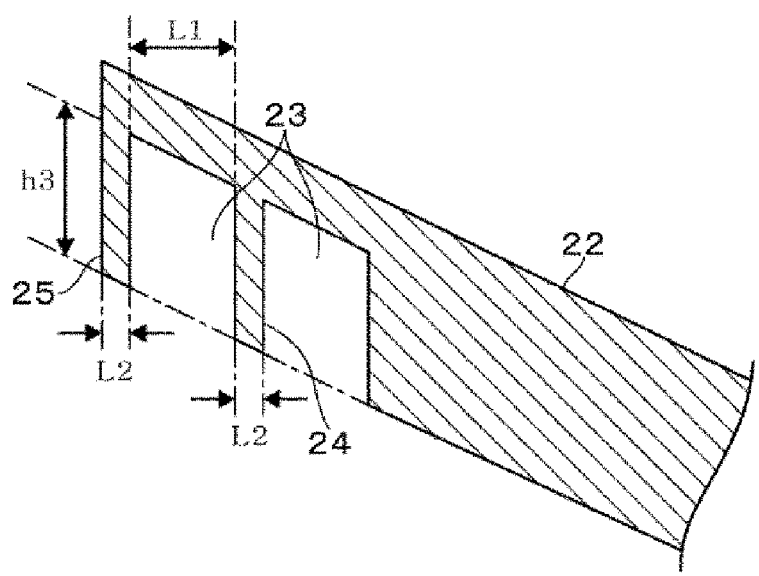
FIG. 4 is an enlarged cross sectional view of the cup body in the developing apparatus.

An example of specific dimensions of the cup body 1 of the developing apparatus according to the above-described exemplary embodiment will be described with reference to FIG. 3 and FIG. 4. As depicted in FIG. 3, an inclination angle θ1 of the inclined surface 32 of the guide member 3 is set to be in the range from 5° to 20°, in this example, 8°; an inclination angle θ2 of the inner surface of the inclined portion 22 of the surrounding member 2 is set to be in the range from 10° to 30°, in this example, 22°. Accordingly, an angle between the inner surface of the inclined portion 22 of the surrounding member 2 and the inclined surface 32 of the guide member 3 is set to be in the range from 0° to 20°, in this example, 14°. Further, a distance d1 of the narrowest gap between the inner surface of the inclined portion 22 of the surrounding member 2 and the inclined surface 32 of the guide member 3 is set to be in the range from 3 mm to 10 mm, in this example, 5 mm. In addition, a distance d2 between the inner surface of the cylindrical portion 21 of the surrounding member 2 and the vertical wall 33 of the guide member 3 is set to be in the range from 3 mm to 10 mm, in this example, 8 mm.

Further, a horizontal distance d3 from an edge of the wafer W held by the spin chuck 11 to a height position on an inner surface of the surrounding member 2 at a level with a top surface of the wafer W is set to be in the range from 20 mm to 40 mm, in this example, 30 mm. A horizontal distance d4 between an upper end of the surrounding member 2 and the edge of the wafer W held by the spin chuck 11 is set to be in the range from 3 mm to 5 mm, in this example, 5 mm. Furthermore, a distance h1 from a height of the top surface of the wafer W to a height of an upper end of the inner surface of the surrounding member 2 is set to be in the range from 5 mm to 10 mm, in this example, 10 mm. Moreover, a length h2 from an upper end of an outer surface of the inclined portion 22 of the surrounding member 2 to the upper end of the inner surface thereof is set to be in the range from 10 mm to 20 mm, in this example, 13 mm.

Further, in order to suppress a liquid droplet scattered from the wafer W from colliding with the groove portions 23, the groove portions 23 are provided at an upper end side of the inner surface of the surrounding member 2 above the height position of the top surface of the wafer W, and a spacing distance d5 from a point on the inner surface of the surrounding member 2 intersecting with a straight line extended from the top surface of the wafer W to the lower groove portion 23 is set to be in the range from 0 mm to 13 mm, in this example, 13 mm, and a height difference thereof is set to be in the range from 0 mm to 10 mm, in this example, 5 mm. The groove portions 23 are formed within a range from 10 mm to 27 mm along the inclined portion 22, in this example, within a range d6 of 14 mm. As depicted in FIG. 4, a width L1 of each groove portion 23 is set to be in the range from 4 mm to 10 mm, in this example, 5 mm, and a depth h3 of each groove portion 23 is set to be in the range from 8 mm to 10 mm, in this example, 8 mm to 9.2 mm.

Further, a thickness L2 of a wall portion 24 between the two groove portions 23 and a thickness L2 of a wall portion 25, formed at the upper end side of the surrounding member 2, of the groove portion 23 formed at the uppermost side of the surrounding member 2 is set to be in the range from 0.5 mm to 2 mm, in this example, 1 mm, respectively. Further, though the groove portions 23 are extended in the vertical direction with respect to the horizontal plane, the groove portions 23 may be formed such that upper sides thereof are inclined outwards. In such a case, an angle between the horizontal plane and each groove portion 23 may set to be in the range from 90° to 120°.

Referring back to FIG. 1, the developing apparatus is equipped with a developing liquid nozzle 5; and a cleaning liquid nozzle 6 configured to supply a cleaning liquid such as, but not limited to, pure water. The developing liquid nozzle 5 is connected to a developing liquid supply mechanism 52 storing a developing liquid therein via a developing liquid supply path 51. The developing liquid supply mechanism 52 is equipped with a unit configured to force-feed the developing liquid to the developing liquid nozzle 5, a valve and a mass flow controller for controlling a flow rate of the developing liquid, and so forth. The cleaning liquid nozzle 6 is connected via a cleaning liquid supply path 61 to a cleaning liquid supply mechanism 62 configured to supply the cleaning liquid such as the pure water for performing a cleaning processing. The cleaning liquid supply mechanism 62 is equipped with a unit configured to force-feed the cleaning liquid to the cleaning liquid nozzle 6, a valve and a mass flow controller for controlling a flow rate of the cleaning liquid, and so forth. Further, the developing apparatus includes, for example, a fan filter unit (FFU) 9 above the cup body 1, and a downflow of air is formed toward the cup body 1 while the developing processing is being performed.

The developing apparatus includes a controller 100. The controller 100 is implemented by, by way of example, a computer and includes a memory, a CPU and a program. The program includes a processing step group for controlling a series of operations of each component and a transfer schedule of the wafer W in which the carried wafer W is held by spin chuck 11, the developing processing is performed, the cleaning processing and a drying processing is performed, and the wafer W is carried out of the developing apparatus. These programs (including a program regarding an input or a display of processing parameters) are installed in the controller 100 by being stored in a recording medium such as a hard disk, a compact disk, a magneto-optical disk or a memory card.

Now, a sequence of a developing processing performed in the developing apparatus will be explained. A wafer W exposed to light after a resist film is formed thereon is transferred to above the spin chuck 11 by a non-illustrated external transfer arm, and the wafer W is transferred onto the spin chuck 11 by cooperation between the transfer arm and the elevating pins 16 to be attracted to and held by the spin chuck 11.

Subsequently, the developing liquid nozzle 5 is moved to above a central portion of the wafer W and discharges a developing liquid onto the wafer W, so that a developing liquid storage portion is formed. Then, rotation of the wafer W is begun, and while maintaining a rotational speed of, for example, 10 rpm, the developing liquid nozzle 5 is moved toward the edge of the wafer W. Accordingly, the developing liquid storage portion is expanded from the center of the wafer W toward the edge thereof. After the developing liquid nozzle 5 is moved up to the edge of the wafer W, the supply of the developing liquid is stopped, and the developing liquid nozzle 5 is retreated to a non-illustrating standby portion outside the cup body 1. As a result, the developing liquid storage portion is formed to cover the entire surface of the wafer W. Thereafter, the rotation of the wafer W is stopped. A portion of the resist film exposed to the light is insoluble in the developing liquid. Thus, by forming the liquid storage portion of the developing liquid and allowing the liquid storage portion to stay on the wafer W, a soluble portion of the resist film which is not exposed to the light reacts with the developing liquid and to be dissolved in the developing liquid.

Subsequently, if the rotation of the wafer W is resumed, since the fluidity is improved at the portion of the resist film dissolved by the reaction with the developing liquid, the dissolved portion is scattered and removed along with the developing liquid supplied on the surface of the wafer W as the wafer W is rotated.

Thereafter, the cleaning liquid nozzle 6 is moved to a position where the cleaning liquid is discharged toward the center of the wafer W. While rotating the wafer W, the cleaning liquid is supplied toward the center of the wafer W from the cleaning liquid nozzle 6. As a result, a cleaning liquid storage portion is formed on the surface of the wafer W, and this cleaning liquid storage portion is expanded toward the edge of the wafer W. Subsequently, while maintaining the rotational speed of the wafer W at, e.g., 4000 rpm, the cleaning liquid is scattered off the surface of the wafer W. Thereafter, the supply of the cleaning liquid is stopped, and by spinning the wafer W, the surface of the wafer W is dried.

A gas-liquid flow within the cup body 1 at a time of supplying a processing liquid to the wafer W will be explained. When performing the series of the developing processing, the inside of the cup body 1 is evacuated to an exhaust pressure of, e.g., 40 Pa by the factory power, and there is formed an exhaust flow flowing into a gap between the surrounding member 2 and the guide member 3 from the surface of the wafer W. By way of example, if the cleaning liquid is supplied onto the wafer W and the wafer W is rotated at 4000 rpm, the cleaning liquid is scattered from the surface of the wafer W and dispersed within the cup body 1 to float in an atmosphere therein as mist, for example. At this time, the mist and the cleaning liquid scattered from the wafer W is captured by the exhaust flow and is flown into the gap between the surrounding member 2 and the guide member 3. The exhaust flow (gas-liquid flow) that has captured the cleaning liquid and the mist flows between the cylindrical portion 21 of the surrounding member 2 and the vertical wall 33 of the guide member 3, and then, flows into the outer region 46 of the ring-shaped body 4. At this time, a liquid component is flown down into the outer region 46 to be drained through the liquid drain port 43, and a gas component containing the mist is flown into the inner region 45 over the partition wall 41 to be exhausted through the gas exhaust port 44.

Within the cup body 1, however, the air flow exhausted into the cup body 1 from the surface of the wafer W may be scattered and attempt to flow out of the cup body 1 along the inner surface of the surrounding member 2. As a result, the mist contained in the air flow may flow from the cup body 1 to adhere to the wafer W again. Particularly, if the rotational speed of the wafer W is high, for example, about 4000 rpm, the scattered processing liquid may be strongly dispersed to come into strong collision with a wall surface of the cup body 1, so that it is highly likely that the processing liquid may become mist. Therefore, the amount of the mist is increased. In such case, since the mist cannot be exhausted completely, some of the mist may easily adhere to the wafer W.

Figure 5:
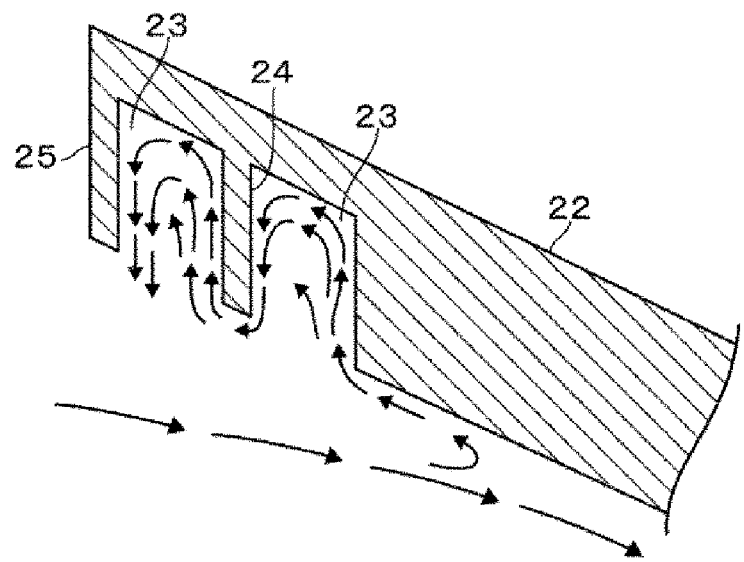
FIG. 5 is a diagram for describing an air flow in a groove portion.

In the above-described exemplary embodiment, in supplying the cleaning liquid onto the wafer W while rotating the wafer W held by the spin chuck 11 and performing the evacuation through the gap between the surrounding member 2 surrounding the wafer W and the guide member 3 surrounding the space under the wafer W, the two groove portions 23 extended in the circumferential direction are provided at the upper edge side on the inner peripheral surface of the surrounding member 2. With this configuration, as depicted in FIG. 5, if the air flow flows along the surrounding member 2, a vortex flow is formed within the groove portions 23 and stays therein. Thus, when the air flow containing the mist is flown along the surrounding member 2, this air flow can be captured within the groove portions 23, so that a flow of the mist to the outside of the cup body 1 can be suppressed. Thus, the adhesion of the mist to the wafer W can be suppressed.

Figure 6:
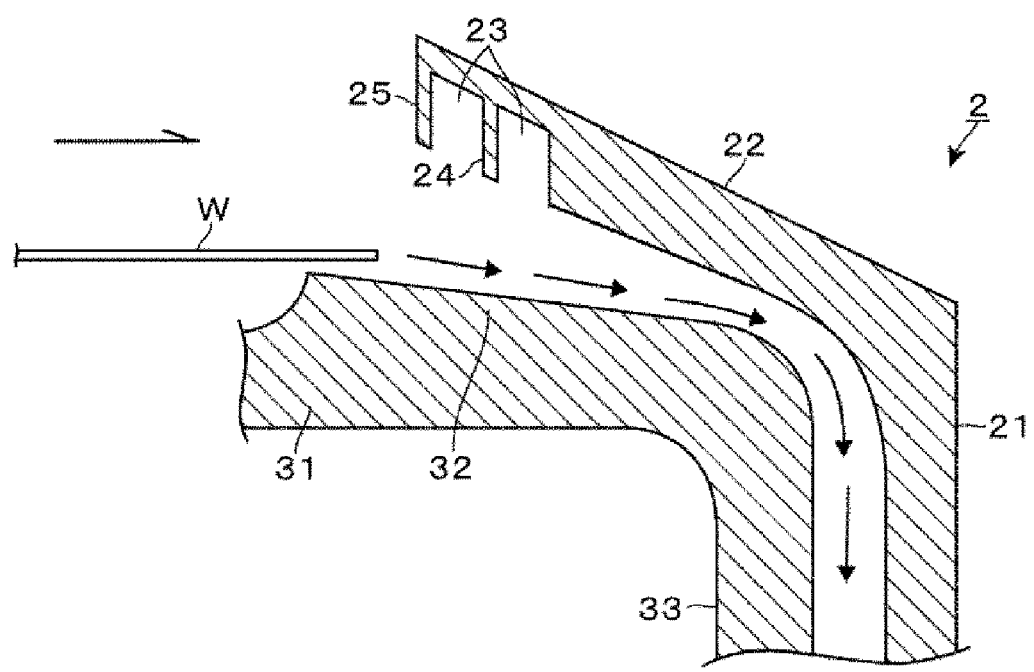
FIG. 6 is a diagram for describing an air flow in the cup body.
Figure 7:
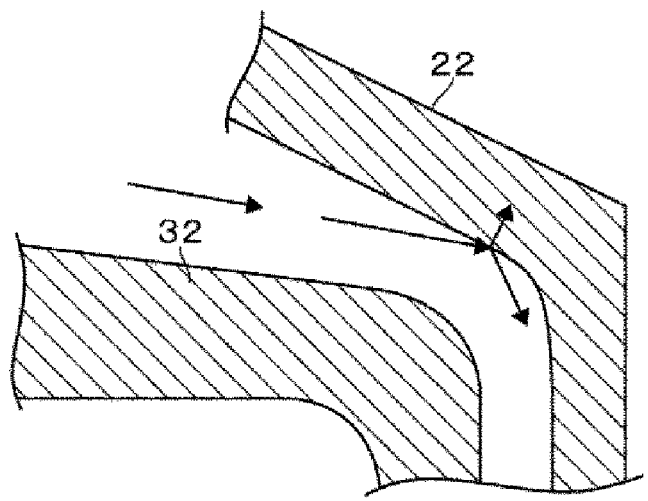
FIG. 7 is a diagram for describing an air flow colliding with an inner surface of the surrounding member.

Furthermore, the air flow flowing into the cup body 1 from the surface of the wafer W is flown out from the surface of the wafer W to the circumference thereof horizontally, as shown in FIG. 6. The air flow flows along the inclined surface 32 of the guide member 3. Thus, if the inclined surface 32 of the guide member 3 and the inner surface of the inclined portion 22 of the surrounding member 2 are not parallel, the air flow flown along the inclined surface 32 of the guide member 3 collide with the inner surface of the surrounding member 2 and attempts to flow along the surrounding member 2 while pressing the inner surface thereof, as shown in FIG. 7. At this time, in case that the parallelism between the inclined surface 32 of the guide member 3 and the inner surface of the inclined portion 22 of the surrounding member 2 is low, that is, if an angle between the inclined surface 32 of the guide member 3 and the inner surface of the inclined portion 22 of the surrounding member 2 is large, the air flow becomes to collide with the inner surface of the surrounding member 2 strongly since a force of pressing the inner surface of the surrounding member 2 is increased by being collided with the inner surface of the surrounding member 2. As a result, the processing liquid may be easily scattered onto the surface of the wafer W. Furthermore, since the cleaning liquid is scattered by rotating the horizontally held wafer W around the vertical axis, if the inclination angle of the inner surface of the inclined portion 22 of the surrounding member 2 is set to be larger, the scattered cleaning liquid strongly collides with the inner surface of the inclined portion 22 of the surrounding member 2, so that the liquid-scattering may easily occur.

In the above-described exemplary embodiment, the angle between the inner surface of the inclined portion 22 of the surrounding member 2 and the inclined surface 32 of the guide member 3 is set to be of a smaller value of 14°. Accordingly, the strong collision of the air flow flown along the inclined surface 32 of the guide member 3 with the inner surface of the surrounding member 2 can be suppressed. Furthermore, since the inclination angle of the inner surface of the inclined portion 22 of the surrounding member 2 is set to be 22°, the liquid-scattering of the cleaning liquid horizontally scattered from the wafer W can be suppressed.

At this time, it is desirable that the inclination angle of the inner surface of the inclined portion 22 of the surrounding member 2 is in the range from +0° to +20° with respect to the inclination angle of the inclined surface 32 of the guide member 3. As this angle approach+0°, less scattering occurs. Furthermore, it is desirable to set the inclination angle of the inner surface of the inclined portion 22 of the surrounding member 2 to be in the range from 10° to 30°.

Moreover, in the above-described exemplary embodiment, the distance of the narrowest gap between the inner surface of the inclined portion 22 of the surrounding member 2 and the inclined surface 32 of the guide member 3 is set to be 5 mm, and the gap between the inner surface of the inclined portion 22 of the surrounding member 2 and the inclined surface 32 of the guide member 3 is narrowed. Accordingly, a flow speed of the exhaust flow is increased, and it becomes difficult for the air flow to be flown to the outside of the cup body 1. Here, to achieve a very high flow speed of the exhaust flow, it is desirable to set the distance of the narrowest gap between the inclined surface 32 of the guide member 3 and the inner surface of the surrounding member 2 to be in the range from 3 mm to 10 mm.

Figure 8:
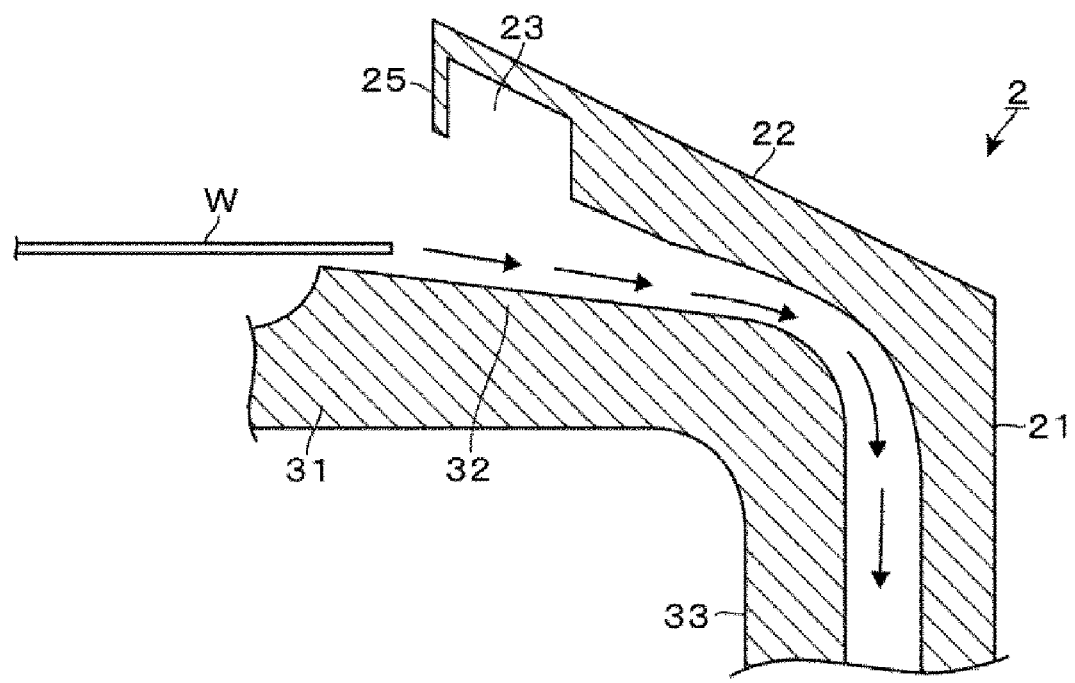
FIG. 8 is a cross sectional view illustrating another example of the surrounding member.

In addition, in the liquid processing apparatus according to the exemplary embodiment, only one groove portion 23 may be provided at the upper end portion of the surrounding member 2, as shown in FIG. 8. As already stated above, by forming the vortex flow within this single groove portion 23, the mist that might be flown out of the cup body 1 can still be captured. However, by forming the two groove portions 23 as in experimental examples to be described later, the mist capturing efficiency can be improved. Desirably, to allow the air flow to stay within the groove portion 23, the groove portion 23 may be formed to have a depth of 8 mm to 10 mm and a width of 4 mm to 10 mm. Further, the number of the groove portions 23 may be three or more.

If the surrounding member 2 is located close to the wafer W held by the spin chuck 11, the liquid-scattering may easily occur. Thus, it is desirable that the edge of the wafer W held by the spin chuck 11 and the inner surface of the surrounding member 2 is spaced apart from each other by 20 mm to 40 mm in the horizontal direction, and the upper end portion of the inner surface of the surrounding member 2 is located higher than the surface of the wafer W by 5 mm to 10 mm. Further, it is also desirable that a horizontal distance between the upper end portion of the surrounding member 2 and the edge of the wafer W is 3 mm to 5 mm. Additionally, by forming a tip end portion of the inclined portion 22 of the surrounding member 2 to have a large thickness, the leakage of the air flow from the inside of the cup body 1 can be suppressed. If, however, the thickness of the tip end portion of the inclined portion 22 of the surrounding member 2 is excessively large, it may be difficult to transfer the wafer W. In this consideration, the thickness of the tip end portion of the inclined portion 22 of the surrounding member 2 may be in the range from 10 mm to 20 mm, desirably.

Figure 9:
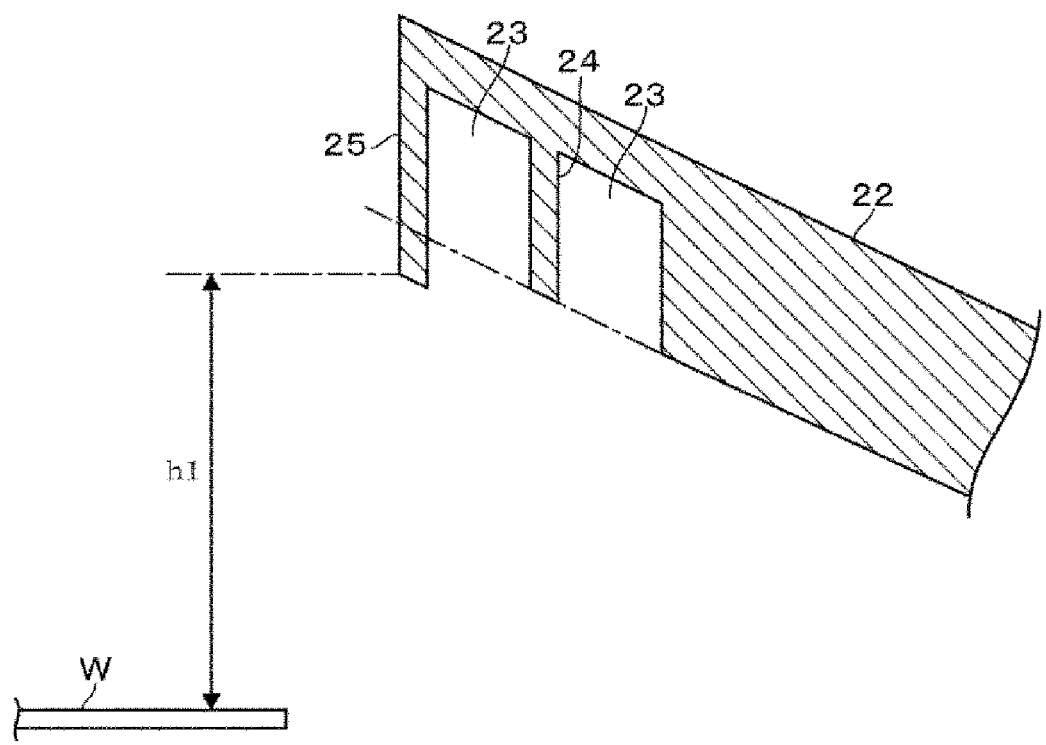
FIG. 9 is a cross sectional view illustrating still another example of the surrounding member.

Further, from the viewpoint of suppressing the scattering of the processing liquid scattered from the wafer W, it is desirable that the wall portion 24 separating the groove portions 23 and the wall portion 25, formed at the upper end side of the surrounding member 2, of the groove portion 23 formed at the uppermost side of the surrounding member 2 are located above a plane extended from the inner surface of the inclined portion 22 of the surrounding member 2. At this time, as shown in FIG. 9, if the wall portion 25 is protruded below the plane extended from the inner surface of the inclined portion 22 of the surrounding member 2, the flow of the mist to the outside of the cup body 1 can be suppressed. In such a case, a height position of the tip end of the wall portion 25 closest to the wafer W is desirably set to be higher than a height position of the surface of the wafer W by 5 mm to 10 mm.

Figure 10:
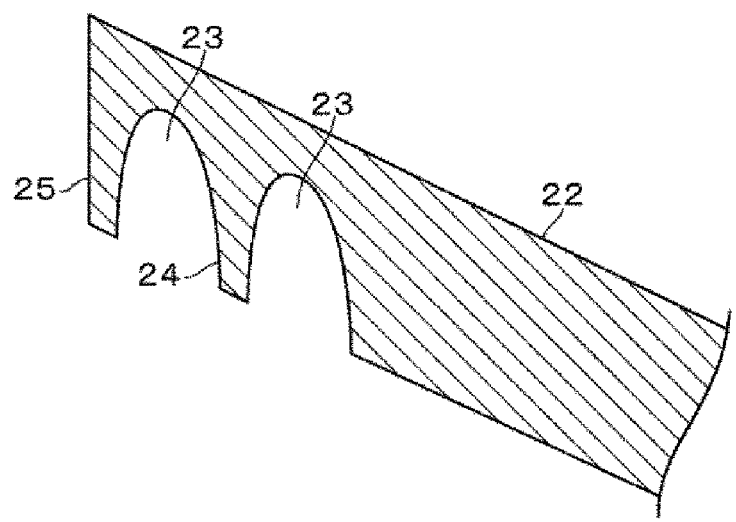
FIG. 10 is a cross sectional view illustrating another example of the shape of the groove portion.
Figure 11:
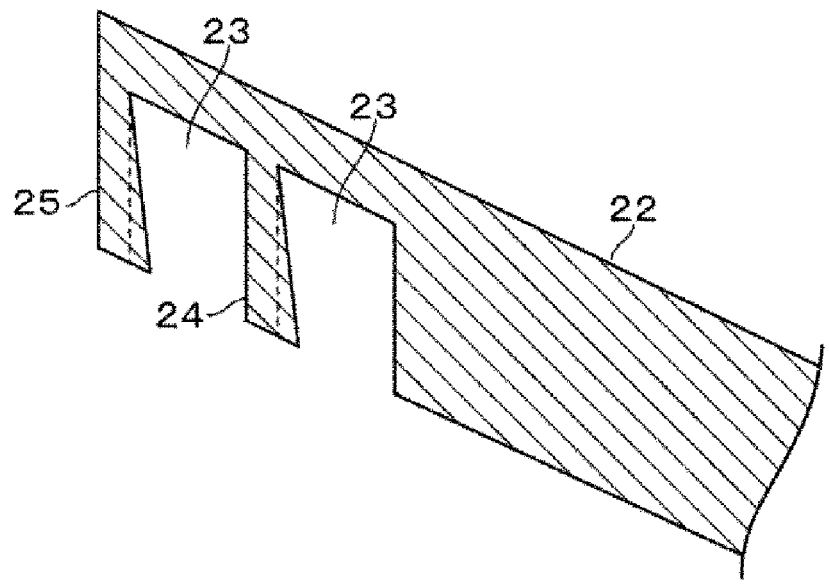
FIG. 11 is a cross sectional view illustrating another example of the shape of the groove portion.
Figure 12:
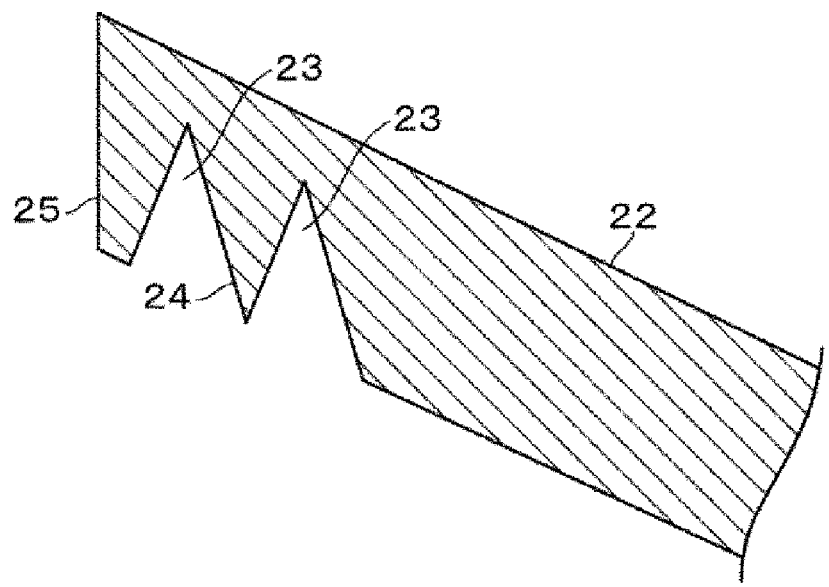
FIG. 12 is a cross sectional view illustrating another example of the shape of the groove portion.

Other examples of the shape of the groove portions 23 will be described with reference to FIG. 10 to FIG. 12. By way of example, corners of the inner surfaces of the groove portions 23 may be chamfered, so that the groove portions 23 may have curved surfaces, as shown in FIG. 10. Further, as illustrated in FIG. 11, the width of the wall portions 24 and 25 may be enlarged outwards when they go downwards. In addition, the groove portions 23 may be formed to have mountain-shaped cross sections as depicted in FIG. 12.

The exemplary embodiment may also be applicable to a liquid processing apparatus configured to remove an oxide film on a surface of a wafer W by supplying a hydrofluoric acid solution to the wafer W, or to a liquid processing apparatus configured to remove a particle on a surface of a wafer W by using another chemical liquid. Besides, the exemplary embodiment is also applicable to a coating apparatus configured to coat a resist liquid on a substrate.

EXPERIMENTAL EXAMPLES

Experimental examples are conducted as follows to investigate effects of the above-described exemplary embodiment.

Experimental Example 1

In an experimental example 1, the cleaning liquid is supplied toward the wafer W by using the developing apparatus according to the exemplary embodiment.

Experimental Example 2

An experimental example 2 employs the same configuration as that of the experimental example 1 except that a single groove portion 23 having a width of 10 mm and a depth of 8 mm to 9.2 mm is formed on the inner surface of the upper end portion of the surrounding member 2.

Comparative Example 1

Figure 13:
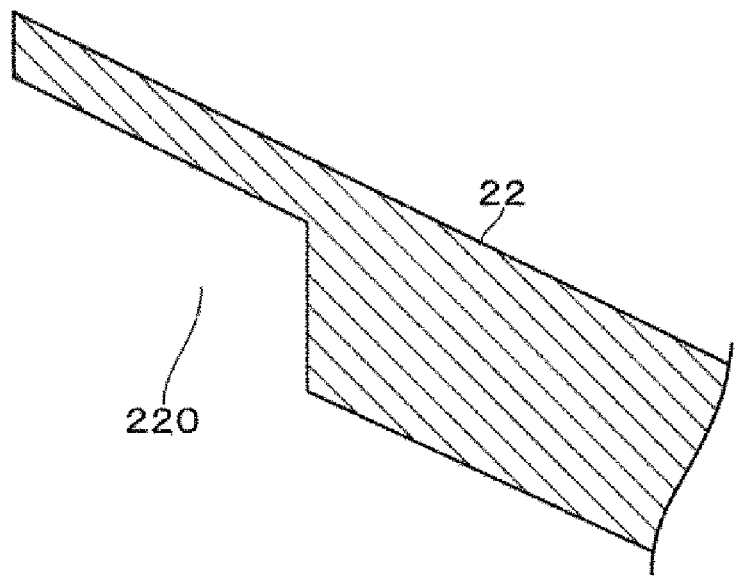
FIG. 13 is a cross sectional view illustrating a surrounding member according to Comparative example 1.

As illustrated in FIG. 13, a comparative example 1 employs the same configuration as that of the experimental example 1 except that a notch 220 having a length of 14 mm from the tip end of the surrounding member 2 and a depth of 8 mm is formed on the inner surface of the upper end portion of the surrounding member 2 along the edge of the tip end portion of the surrounding member 2.

Comparative Example 2

A comparative example 2 employs the same configuration as that of the experimental example 1 except that the surrounding member 2 is not provided with the groove portion 23.

Comparative Example 3

Figure 14:
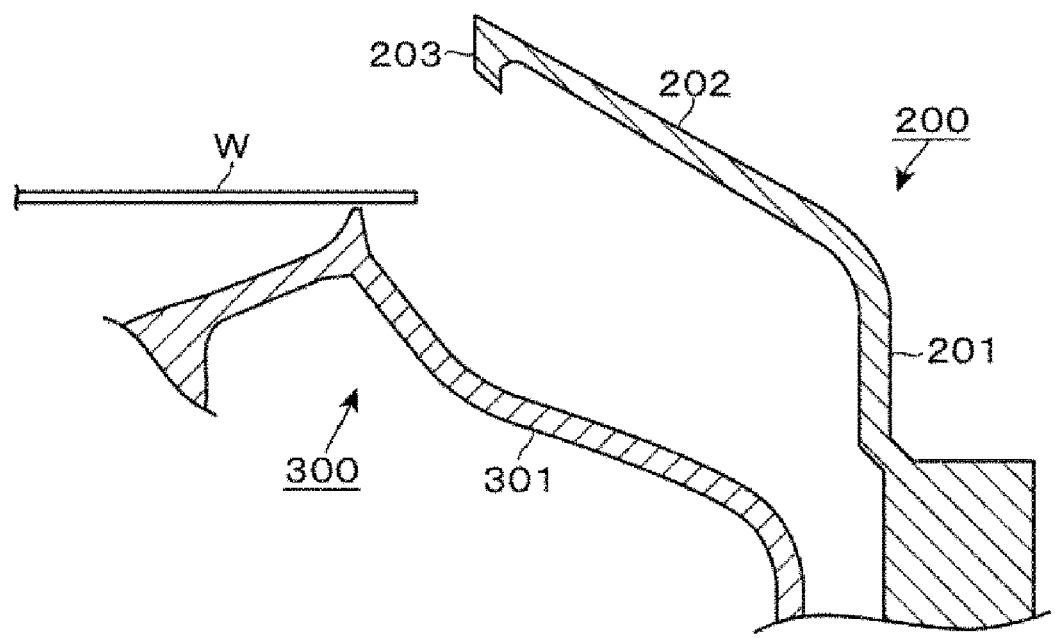
FIG. 14 is a cross section view illustrating a cup body according to Comparative example 3.

In a developing apparatus according to the comparative example 3, as shown in FIG. 14, an inclined surface 301 of a guide member 300 is gently curved downwards, and an inclined portion 202 extended toward the outside of the wafer W held by the spin chuck 11 is formed by extending a cylindrical portion 201 of a surrounding member 200 to a higher position than in the developing apparatus according to the experimental examples. Further, a downwardly projecting protrusion 203 is formed at an upper end portion of the inclined portion 202. Accordingly, in the developing apparatus according to the comparative example 3, an angle between the inclined surface 301 of the guide member 300 and an inner surface of the inclined portion 202 of the surrounding member 200 is larger than that in the experimental examples, and there is provided a large space between the inclined surface 301 of the guide member 300 and an inner surface of the surrounding member 200.

The number of mists at the outside of the cup body 1 at a time of supplying the cleaning liquid onto the wafer W is calculated for individual cases of using the developing apparatuses of the experimental examples 1 and 2 and the comparative examples 1 to 3. Specifically, by using each of the developing apparatuses of the experimental examples 1 and 2 and the comparative examples 1 to 3, the cleaning liquid is supplied onto the wafer W while rotating the wafer W at 4000 rpm. A particle counter is provided at the outside of the cup body 1, and the number of mists is calculated for a time period during which the cleaning liquid is supplied onto the wafer W while the wafer W is being rotated at 4000 rpm. When supplying the cleaning liquid, the exhaust pressure is set to be 30 Pa, 35 Pa, 40 Pa, 45 Pa, 50 Pa, 55 Pa and 60 Pa in the experimental example 1; 35 Pa, 40 Pa, 45 Pa, 50 Pa, 55 Pa and 60 Pa in the experimental example 2 and the comparative example 2; and 40 Pa, 45 Pa, 50 Pa, 55 Pa and 60 Pa in the comparative example 1. Further, the exhaust pressure in the comparative example 3 is set to be 60 Pa. Table 1 shows results of these examples, that is, it specifies the number of mists calculated at the outside of the cup body 1 when the various exhaust pressures are set in the experimental examples 1 and 2 and the comparative examples 1 to 3.

TABLE 1

| Exhaust pressure (Pa) | Experimental example 1 | Experimental example 2 | Comparative example 1 | Comparative example 2 | Comparative example 3 |
|---|---|---|---|---|---|
| 30 | 5805 | | | | |
| 35 | 8 | 554 | | 5179 | |
| 40 | 0 | 0 | 95 | 2 | |
| 45 | 0 | 0 | 0 | 0 | |
| 50 | 0 | 0 | 0 | 0 | |
| 55 | 0 | 0 | 0 | 0 | |
| 60 | 0 | 0 | 0 | 0 | 13974 |

As can be seen from Table 1, in the experimental example 1, when the exhaust pressure is set to be in the range from 40 Pa to 60 Pa, no mist is found. Meanwhile, when the exhaust pressure is set to be 35 Pa, 8 mists are counted, and when the exhaust pressure is set to be 30 Pa, 5805 mists are counted. Further, in the experimental example 2, no mist is observed when the exhaust pressure is set to be in the range form 40 Pa to 60 Pa, whereas 554 mists are counted when the exhaust pressure is set to 35 Pa.

In the comparative example 2, when the exhaust pressure is set to be in the range from 45 Pa to 60 Pa, no mist is found. Meanwhile, when the exhaust pressure is set to be 40 Pa, 2 mists are counted, and when the exhaust pressure is set to be 35 Pa, 5179 mists are counted. Further, in the comparative example 1, when the exhaust pressure is set to be 45 Pa to 60 Pa, no mist is observed, and when the exhaust pressure is set to be 40 Pa, 95 mists are counted. Further, in the comparative example 3, 13974 mists are counted when the exhaust pressure is set to be 60 Pa.

As can be proved from this result, by using the liquid processing apparatus according to the present exemplary embodiment, the flow of mist to the outside of the cup body 1 can be suppressed without needing to increase the exhaust pressure. Furthermore, by providing the groove portion 23 at the tip end of the surrounding member 2, the flow of the mist to the outside of the cup body 1 can be further suppressed. Furthermore, by providing the two groove portions 23 at the surrounding member 2, the flow of the mist to the outside of the cup body 1 can be further suppressed as compared to the case where the single groove portion 23 is provided.

Further, the number of the liquid-scattering (having a diameter equal to or larger than 26 nm) on the surface of the wafer W is counted in individual cases of supplying the cleaning liquid onto the wafer W being rotated at 4000 rpm by using the developing apparatuses of the experimental examples 1 and 2 and the comparative examples 1 to 3. The exhaust pressure when supplying the cleaning liquid is set to be 35 Pa, 40 Pa, 45 Pa, 50 Pa and 55 Pa in the experimental example 1; 40 Pa, 45 Pa, 50 Pa and 55 Pa in the experimental example 2 and the comparative example 1; 45 Pa, 55 Pa and 60 Pa in the comparative example 2. Further, in the comparative example 3, the exhaust pressure is set to be 60 Pa. Each processed wafer W is transferred to the particle counter, and the number of the liquid-scattering at the peripheral portion of the wafer W is counted.

Table 2 shows results of these examples, that is, it specifies the number of the liquid-scattering calculated on the surface of the wafer W after the cleaning liquid is supplied onto the wafer W for the various exhaust pressures set in the experimental examples 1 and 2 and the comparative examples 1 to 3.

TABLE 2

| Exhaust pressure (Pa) | Experimental example 1 | Experimental example 2 | Comparative example 1 | Comparative example 2 | Comparative example 3 |
|---|---|---|---|---|---|
| 35 | 387 | | | | |
| 40 | 8 | 1113 | 11825 | | |
| 45 | 11 | 297 | 2718 | 1504 | |
| 50 | 2 | 5 | 193 | | |
| 55 | 1 | 0 | 11 | 82 | |
| 60 | | | | 8 | 3340 |

As can be seen from Table 2, in the experimental example 1, when the exhaust pressure is set to be 35 Pa, 40 Pa, 45 Pa, 50 Pa and 55 Pa, the number of the liquid-scattering is counted to be 387, 8, 11, 2 and 1, respectively. Meanwhile, in the experimental example 2, when the exhaust pressure is set to be 40 Pa, 45 Pa, 50 Pa and 55 Pa, the number of the liquid-scattering is counted to be 1113, 297, 5 and 0, respectively.

In the comparative example 1, when the exhaust pressure is set to be 40 Pa, 45 Pa, 50 Pa and 55 Pa, the number of the liquid-scattering is counted to be 11825, 2718, 193, and 11. Further, in the comparative example 2, when the exhaust pressure is set to be 45 Pa, 55 Pa and 60 Pa, the number of the liquid-scattering is counted to be 1504, 82 and 8, respectively. Furthermore, in the comparative example 3, when the exhaust pressure is set to be 60 Pa, 3340 liquid-scattering are counted.

As can be seen from this result, the liquid-scattering to the wafer W can be suppressed by using the liquid processing apparatus according to the present exemplary embodiment. Furthermore, by providing the groove portion 23 at the tip end of the surrounding member 2, the liquid-scattering to the wafer W can be further suppressed. Furthermore, by providing the two groove portions 23 at the surrounding member 2, the liquid-scattering to the wafer W can be further suppressed as compared to the case where the single groove portion 23 is provided.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A liquid processing apparatus configured to perform a processing by supplying a processing liquid onto a substrate from a nozzle, the liquid processing apparatus comprising:
   a substrate holding unit configured to hold the substrate horizontally and rotate the substrate around a vertical axis;
   a surrounding member, surrounding the substrate held by the substrate holding unit, in which inclined portion thereof is inwardly extended obliquely upwards;
   a guide member, surrounding a space under the substrate holding unit along a circumferential direction of the substrate holding unit, in which an inclined surface is formed to be inclined downwardly outwards from a position which is close to and faces an edge portion of a rear surface of the substrate held by the substrate holding unit; and
   a gas exhaust mechanism configured to exhaust an atmosphere around the substrate through a gap between the surrounding member and the guide member,
   wherein a groove portion extended along an entire circumference of the surrounding member is formed at a position of an inner peripheral surface of the surrounding member, and the position is located above a height position of a top surface of the substrate held by the substrate holding unit,
   the inclined portion includes an inner surface and an outer surface each of which is a straight line in a cross sectional view,
   the groove portion includes at least one groove, which is recessed from the inner surface toward the outer surface and formed between two parallel sections of the straight lines formed on the inner surface and the outer surface, and
   the at least one groove includes a recessed surface parallel to the two parallel sections of the straight lines.

2. The liquid processing apparatus of claim 1,
   wherein the at least one groove is plural in number, and a number of the groove is two, and the two grooves are vertically arranged in two levels.

3. The liquid processing apparatus of claim 2,
   wherein an inclination angle of a surface of the surrounding member facing the inclined surface of the guide member is in a range from 10° to 30°.

4. The liquid processing apparatus of claim 2,
   wherein an inclination angle of a surface of the surrounding member facing the inclined surface of the guide member is in a range from +0° to +20° with respect to an inclination angle of the inclined surface of the guide member.

5. The liquid processing apparatus of claim 2,
   wherein each of the groove has a depth of 8 mm to 10 mm and a width of 4 mm to 10 mm.

6. The liquid processing apparatus of claim 2,
   wherein a distance of a narrowest gap between the inclined surface of the guide member and a surface of the surrounding member facing the inclined surface of the guide member is in a range from 3 mm to 10 mm.

7. The liquid processing apparatus of claim 2,
   wherein an edge of the substrate held by the substrate holding unit and a height position of the surrounding member at a level with the top surface of the substrate held by the substrate holding unit is spaced apart by 20 mm to 40 mm in a horizontal direction.

8. The liquid processing apparatus of claim 2,
   wherein a spacing distance from a point on an inner surface of the surrounding member intersecting with a straight line extended from the top surface of the substrate to the groove arranged in the lower level is in a range from 0 mm to 13 mm.

9. The liquid processing apparatus of claim 1,
   wherein an inclination angle of a surface of the surrounding member facing the inclined surface of the guide member is in a range from 10° to 30°.

10. The liquid processing apparatus of claim 9,
    wherein the at least one groove has a depth of 8 mm to 10 mm and a width of 4 mm to 10 mm.

11. The liquid processing apparatus of claim 9,
    wherein a distance of a narrowest gap between the inclined surface of the guide member and the surface of the surrounding member facing the inclined surface of the guide member is in a range from 3 mm to 10 mm.

12. The liquid processing apparatus of claim 9,
    wherein an edge of the substrate held by the substrate holding unit and a height position of the surrounding member at a level with the top surface of the substrate held by the substrate holding unit is spaced apart by 20 mm to 40 mm in a horizontal direction.

13. The liquid processing apparatus of claim 1,
    wherein an inclination angle of a surface of the surrounding member facing the inclined surface of the guide member is in a range from +0° to +20° with respect to an inclination angle of the inclined surface of the guide member.

14. The liquid processing apparatus of claim 13,
    wherein the at least one groove has a depth of 8 mm to 10 mm and a width of 4 mm to 10 mm.

15. The liquid processing apparatus of claim 13,
    wherein a distance of a narrowest gap between the inclined surface of the guide member and the surface of the surrounding member facing the inclined surface of the guide member is in a range from 3 mm to 10 mm.

16. The liquid processing apparatus of claim 13,
    wherein an edge of the substrate held by the substrate holding unit and a height position of the surrounding member at a level with the top surface of the substrate held by the substrate holding unit is spaced apart by 20 mm to 40 mm in a horizontal direction.

17. The liquid processing apparatus of claim 1,
    wherein the at least one groove has a depth of 8 mm to 10 mm and a width of 4 mm to 10 mm.

18. The liquid processing apparatus of claim 1,
    wherein a distance of a narrowest gap between the inclined surface of the guide member and a surface of the surrounding member facing the inclined surface of the guide member is in a range from 3 mm to 10 mm.

19. The liquid processing apparatus of claim 1, wherein an edge of the substrate held by the substrate holding unit and a height position of the surrounding member at a level with the top surface of the substrate held by the substrate holding unit is spaced apart by 20 mm to 40 mm in a horizontal direction.

* * * * *